(12) United States Patent
Moench et al.

(10) Patent No.: US 10,386,178 B2
(45) Date of Patent: Aug. 20, 2019

(54) LASER DEVICE FOR PROJECTING A STRUCTURED LIGHT PATTERN ONTO A SCENE

(71) Applicant: PHILIPS PHOTONICS GMBH, Ulm (DE)

(72) Inventors: Holger Moench, Vaals (NL); Stephan Gronenborn, Aachen (DE); Mark Carpaij, 'S-Hertogenbosch (NL)

(73) Assignee: PHILIPS PHOTONICS GMBH, Ulm (DE)

( * ) Notice: Subject to any disclaimer, the term of this patent is extended or adjusted under 35 U.S.C. 154(b) by 0 days.

(21) Appl. No.: 14/647,836

(22) PCT Filed: Nov. 22, 2013

(86) PCT No.: PCT/IB2013/060325
§ 371 (c)(1),
(2) Date: May 28, 2015

(87) PCT Pub. No.: WO2014/083485
PCT Pub. Date: Jun. 5, 2014

(65) Prior Publication Data
US 2015/0316368 A1    Nov. 5, 2015

Related U.S. Application Data

(60) Provisional application No. 61/731,037, filed on Nov. 29, 2012.

(51) Int. Cl.
*H01S 5/42* (2006.01)
*G01B 11/25* (2006.01)
(Continued)

(52) U.S. Cl.
CPC ........ *G01B 11/254* (2013.01); *G01B 11/2513* (2013.01); *G01S 7/4815* (2013.01);
(Continued)

(58) Field of Classification Search
CPC ... G01B 11/254; G01B 11/2513; H01S 5/423; H01S 5/005; H01S 5/18394; H04N 5/235;
(Continued)

(56) References Cited

U.S. PATENT DOCUMENTS 7,844,079 B2    11/2010   Hassebrook
8,294,833 B2    10/2012   Deppe
(Continued)

FOREIGN PATENT DOCUMENTS

JP    2012177671 A    9/2012
WO    WO2009153699 A1    12/2009
(Continued)

OTHER PUBLICATIONS

Kinect, http://en.wikipedia.org/wiki/Kinect.
(Continued)

*Primary Examiner* — Xinning(Tom) Niu
(74) *Attorney, Agent, or Firm* — Leydig, Voit & Mayer, Ltd.

(57) ABSTRACT

The present invention relates to a laser device (10) for projecting a structured light pattern (9) onto a scene (15). The device is formed of several arrays (1) of semiconductor lasers (2), each array (1) comprising an irregular distribution of emission areas (2a) of the semiconductor lasers (2). One or several imaging optics (4) image said arrays (1) to an imaging space and superpose the images of said arrays (1) in the imaging space to form said light pattern (9). The proposed laser device generates a light pattern with high contrast and efficiency which may be used for 3D imaging systems, e. g. in automotive applications.

14 Claims, 3 Drawing Sheets

(51) Int. Cl.
*H04N 5/235* (2006.01)
*H04N 5/265* (2006.01)
*H01S 5/00* (2006.01)
*G01S 7/481* (2006.01)
*H01S 5/183* (2006.01)
*G01S 17/46* (2006.01)
*G01S 17/89* (2006.01)
*G01S 17/93* (2006.01)

(52) U.S. Cl.
CPC .............. *H01S 5/005* (2013.01); *H01S 5/423* (2013.01); *H04N 5/235* (2013.01); *H04N 5/265* (2013.01); *G01S 17/46* (2013.01); *G01S 17/89* (2013.01); *G01S 17/936* (2013.01); *H01S 5/18394* (2013.01)

(58) Field of Classification Search
CPC ....... H04N 5/265; G01S 7/4815; G01S 17/46; G01S 17/936; G01S 17/89
See application file for complete search history.

(56) References Cited

U.S. PATENT DOCUMENTS

| | | | |
|---|---|---|---|
| 9,030,529 B2 | 5/2015 | Chen | |
| 9,229,107 B2 | 1/2016 | Bell | |
| 9,582,889 B2 | 2/2017 | Shpunt | |
| 9,696,137 B2 | 7/2017 | Braker | |
| 2003/0048819 A1* | 3/2003 | Nagano | G02B 6/4206 372/36 |
| 2005/0286767 A1 | 12/2005 | Hager | |
| 2007/0019181 A1 | 1/2007 | Sinclair | |
| 2008/0232679 A1 | 9/2008 | Hahn | |
| 2010/0073461 A1 | 3/2010 | Hammes | |
| 2012/0051588 A1 | 3/2012 | McEldowney | |
| 2012/0162631 A1 | 6/2012 | Hutchin | |
| 2012/0243100 A1 | 9/2012 | Kessler | |
| 2012/0281293 A1* | 11/2012 | Gronenborn | B23K 26/0608 359/619 |
| 2012/0293625 A1* | 11/2012 | Schneider | F16P 3/142 348/46 |

FOREIGN PATENT DOCUMENTS

| | | |
|---|---|---|
| WO | WO2011021140 A2 | 2/2011 |
| WO | WO2013171613 A1 | 11/2013 |

OTHER PUBLICATIONS

Moench H. et al., "High Power VCSEL Systems for Tailored Intensity Distributions", Proceedings of SPIE, International Society for Optical Engineering, v7952, 795207-1-11 (2011).

* cited by examiner

LASER DEVICE FOR PROJECTING A STRUCTURED LIGHT PATTERN ONTO A SCENE

FIELD AND BACKGROUND OF THE INVENTION

The present invention relates to a laser device for projecting a structured light pattern onto a scene using several arrays of semiconductor lasers, in particular vertical cavity surface emitting lasers (VCSELs). Structured light patterns projected onto a scene and observed with a camera enable the extraction of 3D information by image processing. Such a method is applied e. g. in the Microsoft Kinect™ game console and recently discussed for industrial applications, especially in the automotive field. In this field the new EU-NCAP safety norm enforces a distance measurement which is able to detect pedestrians and provides a resolution which allows autonomous measures taken by the car system.

The required structured light pattern can be generated by dedicated micro-optical systems like micro-lens arrays or diffractive optical elements (DOE) which are illuminated by a laser, e. g. by an array of VCSELs. An example is shown in US 2012/051588 A1, which discloses a laser device for projecting a structured light pattern onto a scene using at least one VCSEL array. The light from the VCSEL array is focused through a collimating micro-lens array which directs the beams from the VCSEL array to a DOE. The DOE forms the beams into a variety of light patterns which then enable the desired 3D imaging.

These known optical systems suffer from a loss in brightness and optical efficiency mainly because of two reasons. They are illuminated with an average brightness always lower than the maximum brightness of the laser source and their fill factor is limited since the need for a randomized pattern requires a non dense packing. Furthermore the maximum contrast between bright and dark regions is low.

SUMMARY OF THE INVENTION

It is an object of the present invention to provide a laser device for projecting a structured light pattern which does not have the above drawbacks and can be used in applications for extracting 3D information from a scene onto which the structured light pattern is projected.

The object is achieved with the laser device according to claim 1. Advantageous embodiments of the device are subject matter of the dependent claims or can be deduced from the subsequent portions of the description and preferred embodiments.

The proposed laser device is formed of several arrays of semiconductor lasers, each array comprising a preferably different irregular distribution of emission areas of the semiconductor lasers. This distribution deviates from a regular arrangement of the emission areas, e.g. in a grid or hexagonal pattern, preferably in a randomized fashion. One or several optics are arranged in front of the arrays of semiconductor lasers to image said arrays to an imaging space and to superpose the images of said arrays in the imaging space thereby forming said light pattern. The light pattern, which may be projected to a scene or an imaging plane in the imaging space is composed of a plurality of beam spots originating from the semiconductor lasers of each array.

With the proposed laser device the semiconductor lasers of each array are imaged directly into the image space. This image space corresponds to the capturing area of a 3D imaging system or system for extracting 3D information from a scene arranged in this image space. Due to the direct imaging a high efficiency of the laser device and a maximum contrast between bright and dark regions of the structured light pattern are achieved. Furthermore, the fill factor is increased compared with known solutions since the images of the several semiconductor laser arrays are superimposed in the image space resulting in an increased density of beam spots due to the superposition. The distribution of the emission areas of the semiconductor lasers of each array may be completely randomized with the condition that necessary distances between the emission areas due to the manufacturing process and construction of the lasers are maintained. The distribution of the emission areas of each array may also be chosen such that the deviation of the position of these areas from a regular pattern is randomized but limited in the maximum distance of deviation, for example limited to a maximum distance of once or twice the diameter of the emission area in the corresponding direction of deviation. In the latter case preferably the distribution of the emission areas in each array and the superposition of the images of these arrays in the image space are selected such that not all but most of the beam spots do not overlap in the image space, preferably more than 80%.

A sufficient resolution of the scene requires about 300 randomized beam spots in horizontal direction (x-direction) and about 40 beam spots vertical (y-direction) to meet the system requirements envisioned by EU-NCAP. When using VCSEL arrays as light sources the minimum pitch in such an array according to the design rules involving processing tolerances, etch slopes and minimum oxide widths may be for example about 33 µm for a small active area VCSEL of e. g. 3 µm active diameter. The active diameter corresponds to the emission area of the VCSEL. Larger active diameters require a larger pitch, e. g. a 10 µm active area requires a 40 µm pitch. An irregular distribution or a randomization of the distribution of VCSELs according to the present invention means a freedom to move the position of a VCSEL mesa independent from the position of the neighboring VCSELs. A meaningful randomization or distribution requires a shift of the active areas of the VCSELs (with respect to an arrangement in a regular pattern) by at least the active diameter in all directions. This shift has to be added to the pitch in a regular pattern, i. e. pitch=30 µm+3*d, wherein d represents the active diameter. Therefore the minimum pitch is e.g. 40 to 60 µm for relevant active diameters of the VCSELs between 3 µm and 10 µm. Multiplied by 300 required beam spots this would result in a chip size of 12 to 18 mm in the horizontal dimension when using only one VCSEL array as light source. Such a chip size is far too large to be hard soldered due to the CTE mismatch (CTE: coefficient of thermal expansion) of the materials in a chip package. Furthermore, such a large chip requires a huge area of the VCSEL wafer to be free of defects or in other words the production yield would be critically low. A simple split of the arrays into several parts would lead to problems with seams, i. e. dead regions, which have to be avoided. Taking into account the above considerations the inventors of the present invention recognized that these problems can be avoided by superposing the images of several smaller semiconductor or VCSEL arrays in the image space. This superposition also has the further advantage that failure patterns of single VCSEL arrays which show a clustering of defective mesas do not lead to dead areas.

The irregular or randomized distribution of the emission areas of the semiconductor lasers according to one embodiment of the present invention is characterized by a random shift of the individual emitters in each array by position in the two directions of the surface with respect to an arrangement in a regular pattern. This shift covers a distance of at least the active diameter of the semiconductor laser, i.e. some of the lasers of each array are shifted by at least this distance. In another embodiment the distribution of the emission areas or lasers in each array is completely randomized. The term randomization means that this shift in the position with respect to a regular pattern of each individual emitter or the randomized distribution can be generated by a randomizing algorithm. The term random or randomization in this context is however not restricted to the generation by a randomizing algorithm but also covers irregular distributions in which the shifts are only selected to avoid any periodicity or regularity in the distribution.

In one of the embodiments of the proposed laser device the imaging optics is adapted and arranged such that most of the beam spots on an image plane or scene in the image space comprise at least one neighboring beam spot which originates from a different array. This significantly reduces the problems of dead areas caused by failure patterns in the semiconductor arrays.

In the preferred embodiment of the proposed laser device the semiconductor lasers are VCSELs. Since for small active diameters the pitch of VCSEL arrays is significantly larger than the active diameter of the VCSELs, there is sufficient space to interlace the beam spots of several arrays in the image space. This works best for VCSELs having small active diameters of ≤10 µm, e. g. of 4 µm active diameter and a pitch of 40 µm. Using three VCSEL arrays in the proposed laser device, the interlaced superposing results in an effective active ratio (bright versus dark) which is three times higher than with a single array. A high effective aperture ratio is desirable, because on the one hand a bright spot should cover several pixels of a camera used for a extracting the 3D-information from the scene to which the light pattern is projected (determination of center of gravity is more accurate than single pixel). On the other hand the maximum number of pixels of a cheap camera is limited.

In a further embodiment of the laser device with VCSEL arrays also the shape of the emission area of the VCSELs, i. e. the emitting aperture or active region of the VCSELs, is varied. With such a variation of the VCSEL shape ambiguities in the recorded image for 3D information extraction are resolved more easily. As a consequence the number of spots can be reduced and less than 300 horizontal spots are required in the above mentioned application to fulfill the EU-NCAP safety norm. The need for a larger number of beam spots partially is based on the need to resolve ambiguities and not only for angular resolution. Using two different VCSEL shapes already reduces the ambiguities. Preferably at least three different VCSEL shapes are used, e. g. circle, horizontal rectangle and vertical rectangle. Such shapes can be distinguished by a camera observing the scene onto which the structured light pattern is projected, since the camera resolution is significantly higher than the array resolution. The different VCSEL shapes can be provided on each array, on only one of the arrays or different arrays can provide different VCSEL shapes. If different VCSEL shapes are provided on one array, the different shapes are preferably selected such that all of these shapes have a similar threshold current which means that the emission area of the different shapes is substantially similar. This makes it possible to have different shapes on one single VCSEL chip. If the shapes on a chip are selected identical and several chips or arrays are provided with different shapes, the above need for similar threshold current is released.

In a further embodiment, a control unit for driving the semiconductor arrays is provided which allows to switch on and off the individual arrays or chips sequentially. The resulting image in the image space is then changing in time and this information can be used to resolve ambiguities further. This method is well possible since light is only required for a small percentage of the total time, e. g. 1% for the above automotive application. The sequential switching also reduces the maximum power output which is advantageous in view of the laser safety and the maximum power requirement, e. g. layout of the driver and EMI (electromagnetic interference).

The proposed laser device may be implemented in a 3D imaging system or 3D measuring system. Such a system comprises a camera which images a scene to which the structured light pattern is projected, a synchronization interface between the camera and the laser device and an evaluation unit extracting the required 3D information from the camera image. The synchronization interface ensures that pictures of the scene are only taken during illumination with the structured light pattern. Such a system also includes at least one power supply for the laser device. Also several power supplies can be used, one for each array or chip. For the sequential operation at least part of the circuitry can be shared.

These and other aspects of the invention will be apparent from and elucidated with reference to the embodiments described herein after.

BRIEF DESCRIPTION OF THE DRAWINGS

The proposed laser device is described in the following by way of examples in connection with the accompanying drawings in further detail. The figures show.

DETAILED DESCRIPTION OF EMBODIMENTS

Figure 1:
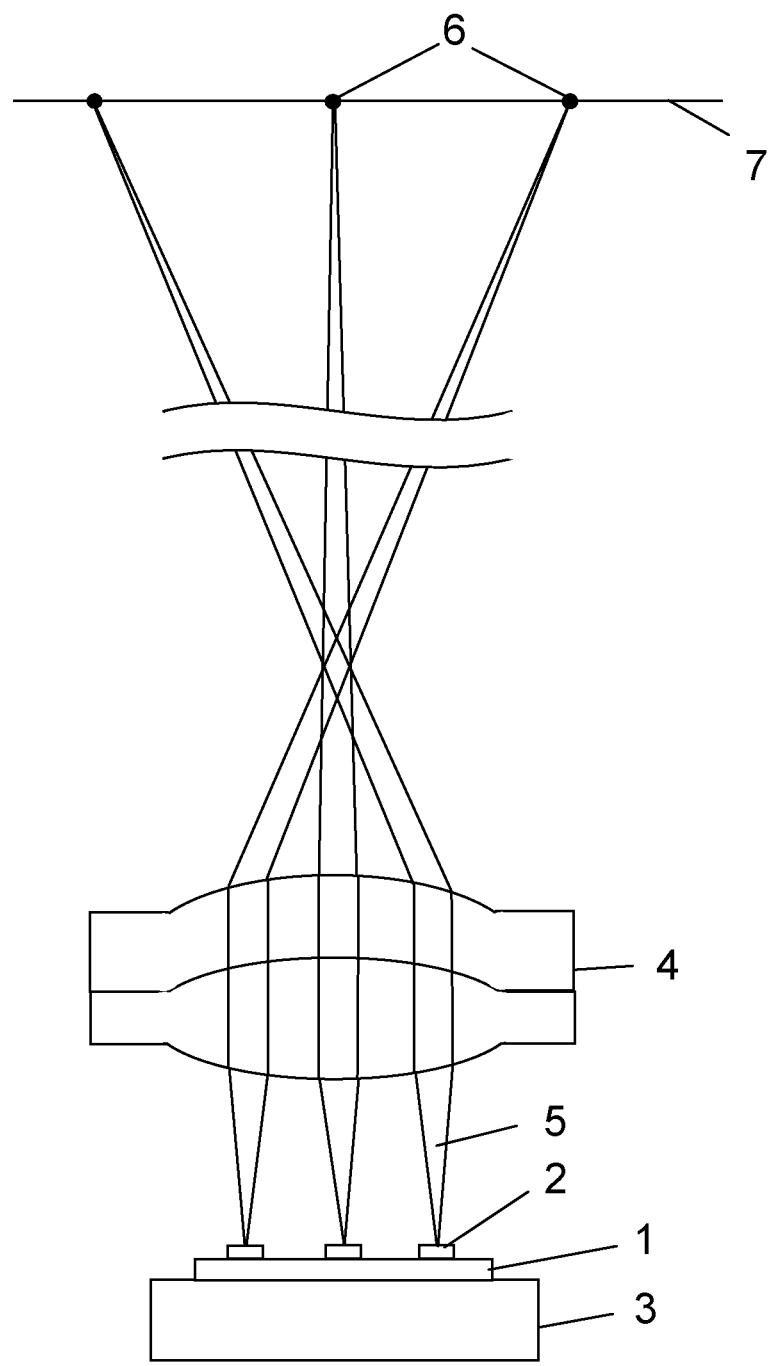
FIG. 1 an example of the projection of one of the VCSEL arrays of the proposed device onto an image plane.

The proposed laser device comprises several semiconductor arrays with corresponding optics to image the emission areas of the semiconductor lasers to an image space. FIG. 1 shows an example for a basic layout of one module of the proposed laser device. Each module comprises one of the VCSEL-arrays used in this example. The VCSEL array is provided in a package providing electrical contacts and heat removal. FIG. 1 shows the corresponding VCSEL chip 1 carrying the VCSEL array with several VCSELs 2. The VCSEL chip 1 is mounted on a heat sink 3 for heat removal. An imaging lens 4 is arranged in front of the VCSEL-chip 1 to image the emission areas of the individual VCSELs 2 of the array to an image plane 7 in the desired image space. The image space is a depth region, also called capturing area in case of a 3D imaging system, into which the VCSEL array is imaged by the lens 4. The imaging conditions to image an e. g. a VCSEL 2 having a 4 µm diameter active area to the image space are very similar to the conditions to image the scene in the image space onto the camera chip with equal pixel size, since this corresponds only to the reverse light path. Therefore a cheap and similar lens 4 can be used in the proposed laser device. With this imaging lens 4 the laser beams 5 emitted by the VCSELs 2 are focused to beam spots 6 in the image space. The shape of these beam spots 6 on an image plane 7 corresponds to the shape of the emission areas of the VCSELs 2 of the VCSEL-chip 1.

In order to image several VCSEL-chips 1 this module has to be replicated. If several modules are placed next to each other on one mounting plane the overlap of the images of the VCSEL arrays in the far field, i.e. in the image space, is already good without any further adjustment. If necessary, the imaging lenses 4 of each of the modules may be slightly adjusted such that the beam spots of the VCSELs 2 of the different VCSEL-chips 1 do not overlap in the image space. In order to improve the adjustment of the lenses adjustment marks, in particular dedicated emission areas, may be provided on each array which have to be superposed in an image plane for an optimal adjustment. If an adjustment is not possible, electronic calibration by the camera picture taken from a test scene can account for slight inaccuracies in fabrication, in order to know the exact distribution of the beam spots in the image space which is necessary for 3D recognition of scenes. If desired a mechanical adjustment of e. g. the position of the imaging lens 4 relative to the VCSEL chip 1 can be provided. This would e.g. enable the adjustment of a spacing distribution of the beam spots in the image space equalized between vertical and horizontal direction.

Figure 2:
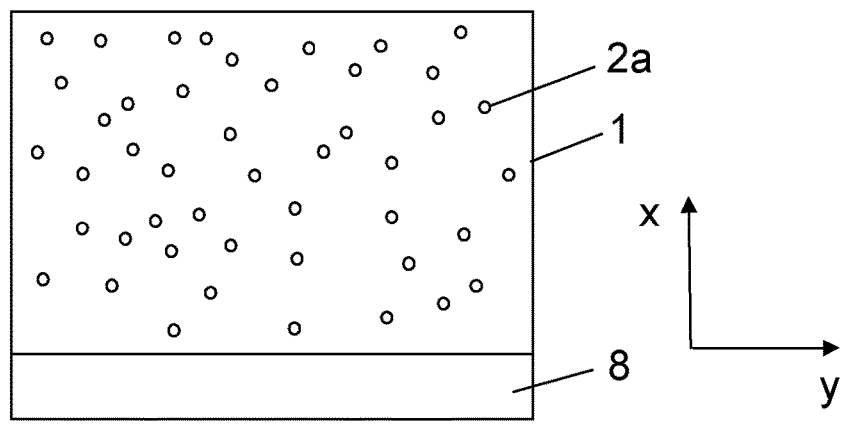
FIG. 2 an example for the randomized distribution of the VCSELs in a VCSEL array of the proposed laser device.

The VCSEL-chips 1 of the proposed laser device are fabricated such that the position of the individual VCSELs 2 on the chip, in particular of the emission areas of the VCSELs 2, deviate from a regular pattern in a randomized fashion or are completely distributed in a randomized fashion. FIG. 2 shows a schematic view of an example of such a distribution of the emission areas 2a of the VCSELs 2 on the chip 1. The bond pad 8 for electrical contacting the VCSELs 2 is also shown in this array layout. As can be seen from FIG. 2, the emission areas 2a of the VCSELs 2 are arranged in a randomized distribution without any periodicity or regularity.

In the following a numerical example of the chip-layout of the VCSEL chip 1 of the proposed laser device is given. The active diameter of the emission areas 2a of the single VCSELs 2 of the chip may be about 4 μm. This diameter is sufficient for a 3 mW power in pulsed operation with e. g. 100 μsec. The corresponding pitch in a regular pattern of such emission areas or VCSELs on a chip may be 42 μm leaving room for randomization by +/−4 μm. This is calculated according to the formula: pitch=30 μm+3*d, wherein d represents the active diameter. In the present example three VCSEL-arrays or VCSEL-chips 1 are used in the laser device. Each chip comprises 100 VCSELs in horizontal (x-) direction and 40 VCSELs in vertical (y-) direction resulting in a chip size of 4.2 mm×1.68 mm. The total chip area (all three chips) consumed is 21.2 mm$^2$. The superposing by the corresponding imaging optics is done mainly in the horizontal direction which means that the average distance between the beam spots is horizontally 3 times smaller than vertically in the imaging plane.

By using an appropriate imaging optics, squeezing the vertical direction is additionally possible if desired. This enables a more equal spacing of the beam spots in horizontal and vertical direction in the above case in which the superposing is mainly performed in the horizontal direction. If required, the shape of the emission areas of the VCSELs can be adapted to such a squeezing, i.e. the vertical dimension (y-dimension) of the active areas of the VCSELs may be selected larger than the horizontal dimension (x-dimension) such that the above squeezing results in beam spots having nearly equal horizontal and vertical dimensions.

The imaging optics may also be adapted such that the images of the different arrays are slightly shifted in vertical direction in order to have similar spacing of the beam spots in both directions rather than an alignment along horizontal lines with dark regions in between.

Figure 3:
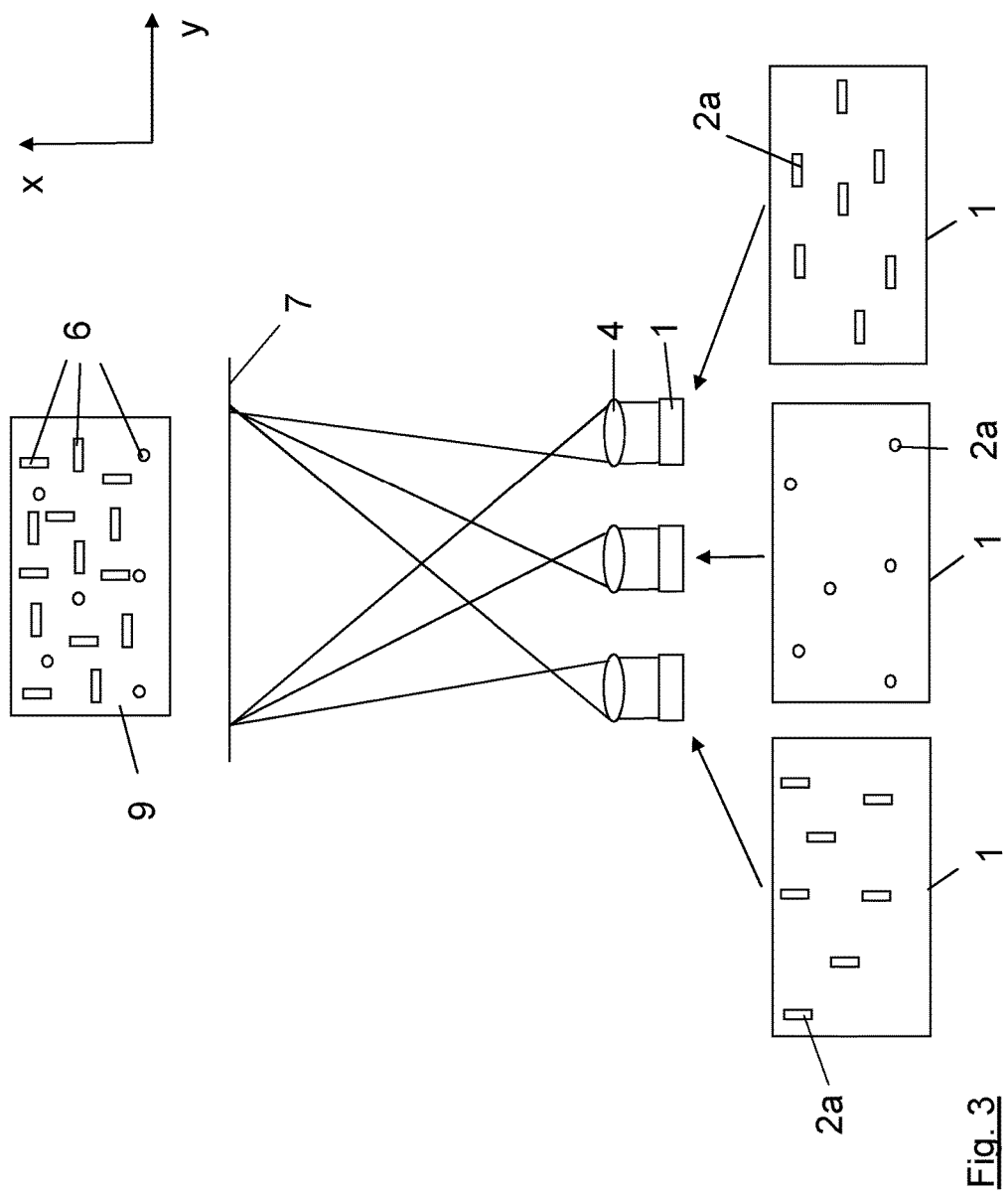
FIG. 3 a schematic view illustrating the superposition of different VCSEL arrays of the proposed laser device in the image space.

The VCSELs of the different arrays may be selected to have different shapes of the active area. FIG. 3 shows three different array layouts having a rectangular shape in the vertical direction, a circular shape and a rectangular shape in the horizontal direction. The three VCSEL chips 1 are imaged with the corresponding imaging lens 4 to the image plane 7 as schematically indicated in the figure. The resulting light pattern 9 is shown in the upper portion of FIG. 3. As can be seen from this light pattern 9, the beam spots 6 originating from each VCSEL chip 1 are imaged into spaces between the beam spots 6 of the remaining VCSEL chips, respectively. This results in a light pattern 9 in which the different VCSEL shapes of the different VCSEL chips 1 are mixed in the imaging plane 7.

The use of the above three different VCSEL shapes may reduce the required number of beam spots for 3D imaging systems by at least a factor of 2. Assuming that an equal portion of each shape is most efficient to avoid ambiguities, a number of 2000 VCSELs of each shape would be sufficient to substitute the 12000 beam spots according to the above requirements of the EU-NCAP safety norm. Splitting this number of VCSELs into three arrays, each array could have the dimensions of e.g. 2.75 mm×2.2 mm. This dimension has been calculated with the assumption that circle area=rectangle area (4×8 μm$^2$)=32 μm$^2$, i.e. circle diameter=6.4 μm, and with a circle array pitch of 50 μm minimum, preferably up to 55 μm in order to have equal conditions with the rectangular arrays with a maximum dimension of 8 μm.

In the example of FIG. 3, the different VCSEL shapes are provided on different arrays. It is also possible to mix the different shapes on the single arrays. In such an embodiment the areas of the different shapes should be selected such that the VCSELs have a similar threshold current.

Figure 4:
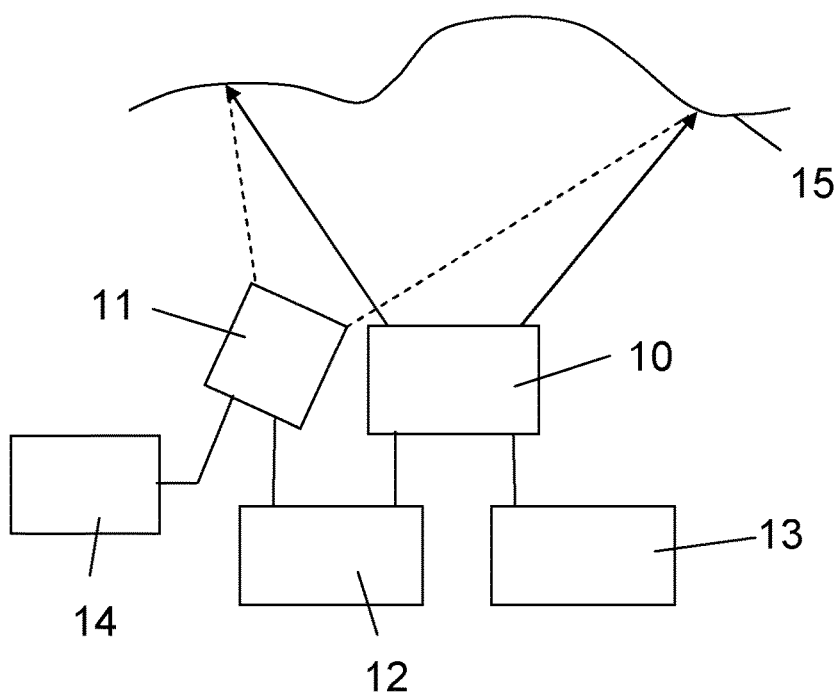
FIG. 4 a schematic view showing a 3D imaging system including the proposed laser device.

FIG. 4 shows a schematic view of an example of a 3D measurement system including the proposed laser device 10. This system also includes a camera 11 taking images of the structured light pattern projected onto a scene 15. The camera 11 is connected via a synchronization unit 12 to the laser device 10 in order to be synchronized with the pulsed illumination of the scene. The power supplies of the laser device 10 may be connected to a control unit 13 for a sequential operation of the different VCSEL chips of the device 10. An evaluation unit 14 may be provided in order to extract the desired 3D information from the image or images captured with the camera 11. Such a system may be used in the applications already described in the introductory portion of the description, in particular in automotive applications for capturing the scene in front of the car.

While the invention has been illustrated and described in detail in the drawings and forgoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. The arrays of the proposed laser device may be arranged in any configuration, for example in a line or in a triangle. Also only two arrays or more than three arrays may be provided in order to achieve the desired superposition. Furthermore, the number of semiconductor lasers of each array may be different from the above example, depending on the required resolution of the system. Instead of VCSELs also other types of semiconductor lasers may be used, e.g. edge emitters. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. The features of all claims of the device can be freely combined. Any reference signs in the claims should not be construed as limiting the scope of the invention.

LIST OF REFERENCE SINGS

1 VCSEL chip
2 VCSEL
2a emission area of VCSEL
3 heat sink
4 imaging lens
5 laser beam
6 laser spot
7 image plane
8 bond pad
9 light pattern
10 laser device
11 camera
12 synchronization unit
13 control unit
14 evaluation unit
15 scene

The invention claimed is:

1. A laser device for projecting a structured light pattern onto a scene, said device comprising:
   a plurality of arrays of semiconductor lasers, wherein each of the arrays, arranged on a separate chip, comprises an irregular distribution of emission areas of the semiconductor lasers, and wherein shapes of the emission areas of at least two of the arrays are different from each other; and
   at least one imaging optics for generating images from said arrays to an imaging space and superposing the images from said arrays in the imaging space to form a light pattern.

2. The device according to claim 1, wherein said imaging optics is configured such that most of the beam spots in said light pattern comprise at least one neighbouring beam spot which originates from the semiconductor laser of a different array.

3. The device according to claim 1, wherein said plurality of arrays of semiconductor lasers are VCSELs.

4. The device according to claim 3, wherein the VCSELs of at least one of said arrays comprise emission areas with at least two different shapes.

5. The device according to claim 3, wherein the VCSELs of at least one of the arrays comprise emission areas of identical shape.

6. The device according to claim 3, wherein diameters of emission areas of the VCSELs in at least one direction in each array are $\leq 10$ μm, a minimum distance between said emission areas being $\geq 20$ μm.

7. The device according to claim 1, wherein said imaging optics is configured such that the superposed images from said arrays are slightly shifted with respect to one another in at least a first direction in the imaging space.

8. The device according to claim 7, wherein said imaging optics is configured to squeeze the superposed images from said arrays in a second direction perpendicular to said first direction in the imaging space, said squeezing being selected to achieve a substantially equal density of beam spots in both directions.

9. The device according to claim 1, further comprising a control unit for sequential switching of the different arrays.

10. The device according to claim 1, further comprising a camera arranged to take an image of a scene in the image space onto which the light pattern is projected.

11. The device according to claim 1, wherein the device is used for a 3D recognition or 3D detection of scenes.

12. The device according to claim 1, wherein the device is used for detection of objects in a car environment.

13. The device according to claim 1, wherein the device is used for the 3D recognition of scenes in industrial production or logistic areas.

14. The device according to claim 1, wherein the device is used in user interfaces.

* * * * *